United States Patent [19]

Tower

[11] Patent Number: 4,541,068

[45] Date of Patent: Sep. 10, 1985

[54] REDUCING NOISE IN INTRODUCING BIAS CHARGE INTO CHARGE TRANSFER DEVICES

[75] Inventor: John R. Tower, Deptford, N.J.

[73] Assignee: RCA Corporation, Princeton, N.J.

[21] Appl. No.: 497,403

[22] Filed: May 23, 1983

[51] Int. Cl.³ .................... G06G 7/16; H03K 5/159
[52] U.S. Cl. .................... 364/825; 364/862; 307/597; 307/603; 333/165
[58] Field of Search ............... 364/807, 825, 861–862, 364/724; 307/440, 444, 597, 603, 607, 296 R, 296 A, 297; 333/165; 328/103, 105, 153

[56] References Cited

U.S. PATENT DOCUMENTS

| | | | |
|---|---|---|---|
| 3,987,293 | 10/1976 | Crooke et al. | 364/825 X |
| 4,035,628 | 7/1977 | Lampe et al. | 364/825 X |
| 4,100,513 | 7/1978 | Weckler | 364/862 X |
| 4,156,914 | 5/1979 | Westell | 364/825 X |
| 4,218,752 | 8/1980 | Hewes et al. | 364/825 |
| 4,243,958 | 1/1981 | Wilde | 333/165 |
| 4,264,983 | 4/1981 | Miller | 364/825 |
| 4,316,258 | 2/1982 | Berger | 364/862 X |

OTHER PUBLICATIONS

"A High Speed Digitally Programmable CCD Transversal Filter" A. M. Chiang & B. E. Burke, 1980 *Government Microcircuit Applications Conference Digest of Papers,* pp. 182 & 183.

"Parallel-In/Serial-Out; A New Approach for C.C.D. Transversal Filters"; K. Knauer, L. Mader, H. J. Pfleiderer, and M. Schlichte; *Electronics Letters,* Mar. 3, 1977, vol. 13, No. 5, pp. 126 & 127.

Primary Examiner—Jerry Smith
Assistant Examiner—Gary V. Harkcom
Attorney, Agent, or Firm—Joseph S. Tripoli; George E. Haas; Allen LeRoy Limberg

[57] ABSTRACT

A bias charge (commonly known as a "fat zero") is divided into a plurality, n, of equal parts. These equal parts are differentially delayed, and the results appearing parallel in time are summed to generate a bias charge with reduced noise. The reduced-noise bias charge is then applied to an input of a charge transfer device — e.g., one of the charge coupled device (CCD) analog shift registers used in a CCD imager to transport charge packets descriptive of picture elements in an imager.

14 Claims, 4 Drawing Figures

REDUCING NOISE IN INTRODUCING BIAS CHARGE INTO CHARGE TRANSFER DEVICES

The present invention relates to the introduction of bias charge (commonly called "fat zero") into charge transfer devices and, more particularly to reducing noise in the level of bias charge.

BACKGROUND OF THE INVENTION

The charge transfer devices may be analog shift registers as are, for example, arrayed in parallel in charge-coupled device (CCD) imagers to store and to transport charge packets descriptive of the picture elements (pixels) in an image. The image is typically in the visible or infrared electromagnetic spectrum. In order to achieve optimal transfer efficiencies, particularly where the number of electrons per pixel sample is low, bias charges must be introduced into the stages of the analog shift registers as they are vacated of previous charge packets during each charge transfer cycle. Introduction of these bias charges is done using a further analog shift register which is receptive of bias charges at its input and which supplies the bias charges from respective ones of its stages to the inputs of the analog shift registers in parallel array.

A problem is encountered with the bias charge introduced during one charge transfer cycle being apt to differ slightly from that introduced during another charge transfer cycle. This generates a type of noise accompanying the signal described on an analog sampling basis by the charge packets in the analog shift register.

SUMMARY OF THE INVENTION

The invention is directed to reducing this noise respective to signal in the analog shift register or other charge transfer device by a time-diversity technique. To this end the bias charge packets are not applied directly to the input of the charge transfer device. Rather they are divided into equal parts and these equal parts are differentially delayed respective to one of the parts by different numbers of charge transfer cycles. The resulting unequally delayed charge packets appearing parallel in time are summed to provide reduced-noise bias charge packets applied to the input of the charge transfer device.

BRIEF DESCRIPTION OF THE DRAWING

In the drawing.

each of FIGS. 1 and 2 is a block schematic of a respective representative apparatus for generating reduced-noise bias charge packets for application to the input of a charge transfer device, in accordance with the present invention.

DESCRIPTION OF THE PREFERRED EMBODIMENT

Figure 1:
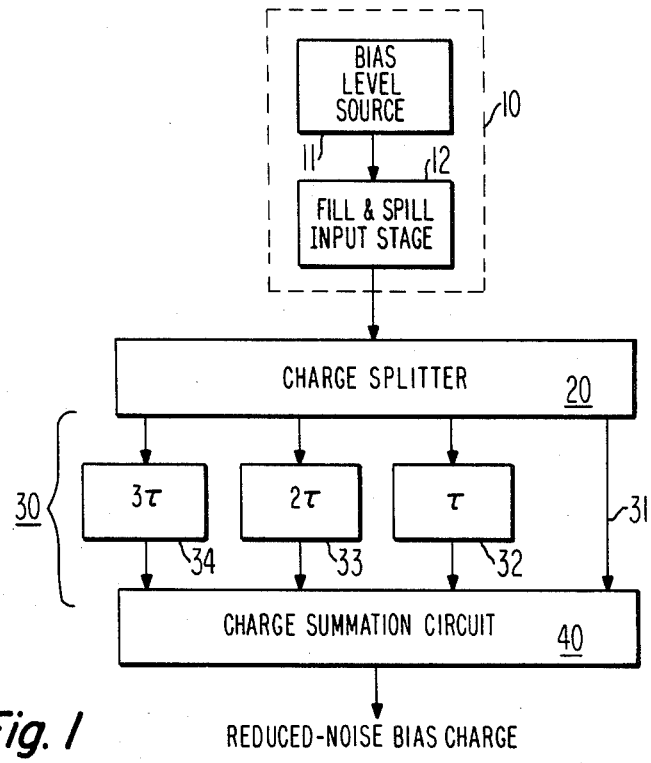
Figure 2:
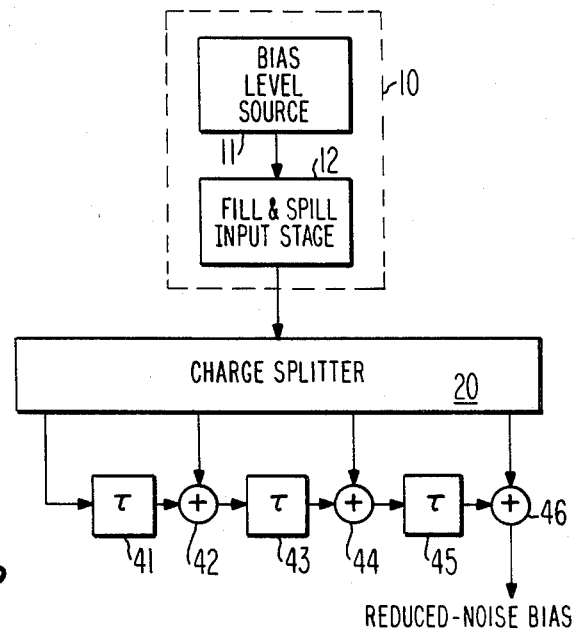

In FIGS. 1 and 2 input bias charge generator 10 supplies input bias charge packets that preferably are initially as low noise as possible. The best previously known generator for bias charge as shown comprises bias level source 11 for establishing a reference voltage level and further comprises a fill-and-spill input stage 12 for generating charge packets at its output descriptive of the reference voltage level applied to its input. This fill-and-spill input stage 12 is generally of the type described by W. F. Kosnocky in U.S. Pat. No. 3,986,198 issued Feb. 10, 1976 and entitled "LOW NOISE CCD INPUT TECHNIQUE". The RMS noise at the output of a fill-and-spill input stage equals $(KTC)^{(\frac{1}{2})}$ where K is Boltzmann's constant, T is temperature in Kelvin, and C is the effective capacitance of output potential well of the fill-and-spill stage. This noise accompanies the "fat zero" signal at generator 10 output.

The charge packets descriptive of samples of output signal and noise which are supplied from generator 10 are applied as input signal to a charge splitter 20. Charge splitter 20 divides those charge packets into a plurality, n in number, of parts. Preferably these are equal aliquot parts. In the FIG. 1 apparatus, described in greater particularity further on this disclosure, n is four.

In certain embodiments of the invention as represented by FIG. 1 these parts are caused to be displaced from each other in time by supplying them to a plurality 30 of charge-coupled-device (CCD) charge transfer channels, n in number, having different amounts of delay in multiples of charge transfer cycle time. To minimize the number of charge transfers, the first charge transfer channel degenerates to a direct connection, the second charge transfer channel consists of a one stage of analog shift register, the third charge transfer channel consists of a two stage analog shift register, and so on, up to the $n^{th}$ charge transfer channel consisting of an $(n-1)$-stage analog shift register. This scheme has minimum latency, or delay from the time charge packets are first entered until charge packets of desired nature first exit the charge transfer apparatus. In any case the charge packets in this plurality 30 of charge transfer channels will each have a signal component equal to fat zero divided by n, and they will each have a noise component of $(KTC)^{(\frac{1}{2})}/n$.

The differentially delayed portions of the original bias charge packets that appear parallel in time at the outputs of the charge transfer channels have correlated fat-zero-divided-by-n signal components. Those packets are summed in a charge summer 40, which may simply comprise a storage well supplied charge from each of the plurality 30 of charge transfer channels, to recover fat-zero signal level (less some usually relatively minor transfer losses).

But the $(KTC)^{(\frac{1}{2})}/n$ RMS noise components of the summed charges are not temporally correlated. So, rather than summing arithmetically as the direct fat zero components do, they sum vectorially to $(KTC/n)^{(\frac{1}{2})}$. Thus RMS noise is reduced by a factor of $n^{(\frac{1}{2})}$, neglecting the effects of partitioning noise in charge splitter 20.

A further advantage of the bias charge generation scheme just described is that any large noise impulse caused by electromagnetic interference (EMI) pick-up or by feed-through will be spread out over n samples, reducing its amplitude by as much as n times in the reduced-noise bias charge output. This can be extremely advantageous in the practical realization of low-noise semiconductor imaging systems of sizeable proportions.

The specific reduced-noise bias charge generator shown in FIG. 1 has a plurality 30 of charge transfer channels numbering four: the first, rightmost channel consisting of a direct connection 31; the second channel next on the left consisting of a single-stage analog shift register 32; the third channel next on the left consisting of a two-stage analog shift register 33; and the fourth, leftmost channel consisting of a four-stage analog shift register 34. That is, n is four, so the reduced-noise bias charge at the output of charge summer 40 has RMS noise of $(KTC)^{(\frac{1}{2})}/2$, half that at the output of fill-and-spill stage 12. A convenient geometry to realize the four charge transfer channels with progressively greater delay is that used for diagonal transfer of charge and described by C. H. Sequin in U.S. Pat. No. 3,934,261 issued Jan. 20, 1976 and entitled "TWO-DIMENSIONAL TRANSFER IN CHARGE TRANSFER DEVICES".

Where one wishes to reduce the noise accompanying the bias charge by larger factors, one can increase the number of charge transfer channels in plurality 30, modifying charge splitter 20 and charge summation circuitry 40 to suit. Eventually the partitioning noise associated with charge splitting will reduce the advantage to be gained with low-pass time-domain filtering of the bias charge in accordance with the invention, but this effect is very much a second-order one. So, for example, sixteen charge transfer channels could be used in an expanded plurality 30' to reduce the noise accompanying the bias charge by four times to $(KTC)^{(\frac{1}{2})}/4$.

FIG. 2 shows an alternative way to provide for time-diverse combining of fractional bias charges. It uses a parallel-input serial-output CCD similar to that described by K. Krauer, L. Mader, H. J. Fleiderer and M. Schlicte in their letter "Parallel-In/Serial-Out: A New Approach for C.C.D. Transversal Filters" in *ELECTRONICS LETTERS*, 3rd March 1977, Vol. 13, No. 5, pp. 126–127. A first of the n outputs of charge splitter 20 is delayed in a single-stage shift register 41 and summed with a second of the n outputs of charge splitter 20 in a charge summation circuit 42. The result is delayed in a further single-stage shift register 43 and summed with a third of the n outputs of charge splitter 20 in charge summation circuit 44, and that result is in turn delayed in a still further single-stage shift register 45. The nature of the continuing addition and delay process where n is greater than 4 should be apparent to the reader. A final charge summation circuit (46 in this case were n equals four) adds the combined delayed outputs of charge splitter 20 with the $n^{th}$, undelayed output of charge splitter 20 to supply the final reduced-noise bias charge.

Other low-pass CCD filter configurations can be adapted to provide for the time diverse combination of charge splitter 20 outputs to develop reduced-noise bias charge.

Figure 3:
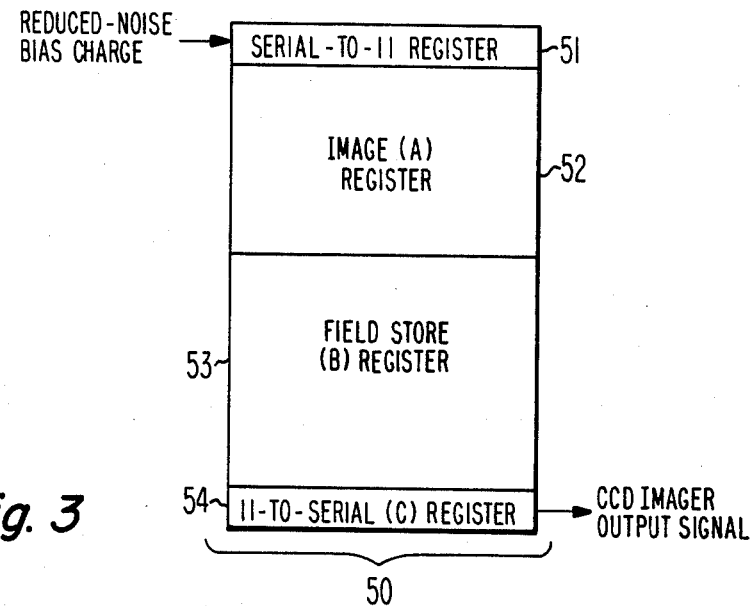
FIGS. 3 and 4 are each block schematics of CCD imagers, used in describing how reduced-noise bias charges may be introduced into CCD imagers in accordance with a further aspect of the invention.

FIG. 3 shows in block schematic form a CCD imager 50 of the vertical field transfer type. It has a serial-to-parallel converting line register 51 for applying reduced-noise bias charges to the inputs of the parallelled charge transfer channels of its image (or A) register 52. Register 52 is the only portion of imager 50 to which radiant energy imager is admitted, and register 52 is conventionally shuttered during field transfer intervals. Image integration may take place in the charge transfer channels of image register 52 or in separate photodetectors between them for inserting charge packets in parallel to an adjacent charge transfer channel.

During these image integration times which take place during field scan of the CCD imager output signal, clocking is halted in registers 51 and 52. A field store, (or B) register 53, to which a previous field of image sampling charge packets was transferred during a field transfer interval in field retrace, has charge packets stored therein clocked forward a row at a time during line retrace.

The row of charge packets advanced out of the B register 53 are loaded in parallel into a parallel-to-serial-converting line (or C) register 54 during a halt in its clocking. During line trace, C register clocking resumes at pixel scan rate, and the charge packets stored in C register are transferred to a charge sensing stage (not specifically shown) for conversion to a CCD imager output signal, normally in voltage form.

During field retrace, registers 52 and 53 are clocked at sufficient rate to transfer charge packets a row at a time from image register 52 to field store register 53. After each successive line of image samples is clocked forward, serial-to-parallel converter register 51 is loaded at relatively very high rate with reduced-noise bias charge samples. And those samples are then entered in parallel into the initial row of the A register 52 as the lines of charge packets in register 52 are advanced by a row. At the end of the field transfer from A register 52 to B register 53, then, A register 52 will be filled with reduced-noise fat-zero bias samples. A register 52 is then unshuttered and image integration takes place over the next field scan interval of imager 50 output signal.

The present invention may be used with CCD line imagers or with CCD imagers of the interline transfer type, as well.

Figure 4:
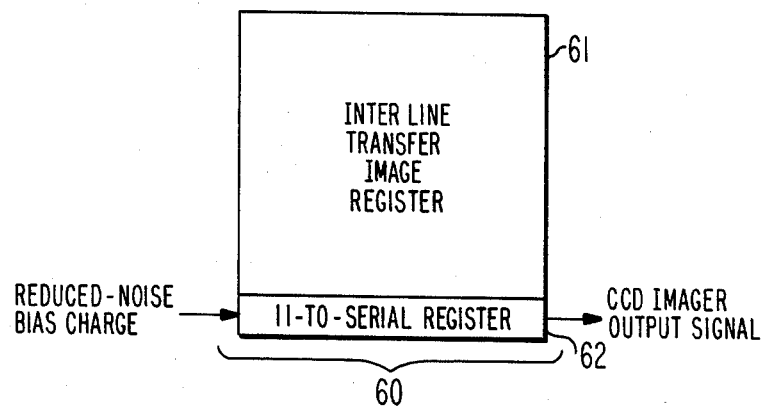

FIG. 4 shows a CCD imager 60 of interline transfer type. Supposing, by way of example imager 60 to use vertical interline transfer, its interline transfer image register 61 comprises columns of photodetectors interspersed with masked CCD shift registers into which photodetector responses are loaded in parallel during field retrace time. The charge samples in these CCD shift registers are advanced a row at a time during line retrace to parallelly load a parallel-to-serial-converting CCD shift register 62. During line trace, the transferred charge samples are clocked out of register 62 at pixel scan rate and converted by an output stage (not specifically shown) at the end of register 62 to supply CCD imager output signal, while reduced-noise bias charge samples are clocked into the input end of register 62 at pixel scan rate to provide fat zero bias for the succeeding row of image samples. Transfer efficiency problems show up most at high clock rates, such as pixel scan rate. So reduced-noise bias charges are generally most needed in the imager output register, which being operated at pixel scan rate generally is the most rapidly clocked CCD shift register.

The field transfer type of CCD imager 50 shown in FIG. 3 may be modified to have reduced-noise bias charges loaded serially into the end of C register and to have its serial-to-parallel register 51 eliminated. The vertical interline transfer imager of FIG. 4 may be modified to have reduced-noise bias charges loaded serially into a serial-to-parallel converting register successive stages of which admit charge into the input ends of the shift registers in image register 61.

What is claimed is:

1. Apparatus for generating reduced-noise bias charge packets for introduction into an input of a charge transfer device, which apparatus comprises:
    means for establishing a bias voltage level;
    a fill-and-spill input stage for periodically supplying, from its output, bias charge packets of a size responsive to bias voltage level applied to its input;
    a plurality, n in number, of charge transfer channels consecutively ordinally numbered first through nth, each charge transfer channel providing a delay between its input and output equal to the periodicity of successive fill-and-spill cycles multiplied by one less than the cardinal number corresponding to the ordinal numbering of that charge transfer channel;

a charge splitter for equally apportioning charge packets received at its input from the output of said fill-and-spill input stage for application from respective outputs thereof to each of the inputs of said charge transfer channels; and means for summing the charge packets that appear parallel in time at the outputs of said charge transfer channels, to generate said reduced-noise bias charge packets.

2. Apparatus as set forth in claim 1 wherein said number n of charge transfer channels share no common paths for charge.

3. Apparatus as set forth in claim 1 wherein said n charge transfer channels and said means for summing charge packets are comprised within a parallel-input, series-output CCD register having (n−1) charge transfer stages consecutively ordinally numbered first through (n−1)$^{th}$;

(n−1) charge summation circuits consecutively ordinally numbered first through (n−1)$^{th}$, each having a first input to which the output of the correspondingly ordinally numbered charge transfer stage connects, having a second input to which a respective one of said charge splitter outputs connects, and having an output, the output of said (n−1)$^{th}$ charge summation circuits being used for supplying said reduced-noise charge packets to said charge transfer device, and the outputs of the remaining charge summation circuits connecting to the input of the next higher ordinally numbered charge transfer stage; and a connection of the remaining charge splitter output to the input of the first charge transfer stage.

4. Apparatus as set forth in claim 1 wherein said charge transfer device is a CCD image register.

5. A method for reducing the noise associated with the introduction of periodically generated bias charge packets into a charge transfer device, which method comprises the steps of:

dividing each said periodically generated bias charge packet into a number n of parts, successively ordinally numbered first through n$^{th}$, n being a plural integer;

differentially delaying each of the parts relative to the others so they are respectively delayed by different numbers of periods and summing the differentially delayed parts that appear parallel in time to provide a reduced-noise bias charge packet each period; and applying the reduced-noise bias charge packets as bias charge to an input of said charge transfer device, rather than applying said periodically generated bias charge packets directly to said input of said charge transfer device.

6. The method of claim 1 wherein the step of dividing each said periodically generated bias charge into a number n of parts consists of the step of dividing each said periodically generated bias charge into n equal aliquot parts.

7. The method of claim 1 wherein the step of differentially delaying each of the parts relative to the others entails delaying each of the parts by a number of periods one less than the cardinal number corresponding to the oridinal numbering of that part.

8. A method as set forth in claim 1 wherein said charge transfer device is a CCD imager having a number of parallelled charge transfer channels arranged in an intermittently clocked image register, used in combination with a method for introducing said reduced-noise bias charge packets into the inputs of those charge transfer channels arranged in an image register, which method uses a serial-to-parallel converting line register and comprises the steps of:

clocking reduced-noise bias charge packets in parallel out of successive stages of said serial-to-parallel converting line register into respective inputs of the charge transfer channels in said image register as charge packets are advanced by a row in said image register; and clocking reduced-noise bias charge packets at relatively high rate in series into an end of said serial-to-parallel-converting line register and through its successive stages until those stages are filled between each set of successive times reduced-bias charge packets are clocked out of the successive stages of said serial-to-parallel-converting line register.

9. A method as set forth in claim 1 wherein said charge transfer device is a CCD imager having a parallel-to-serial converting register to supply its output stage, together with the step of:

clocking reduced-noise charge packets into the input end of said parallel-to-serial converting register as output samples are clocked out serially from its output end.

10. A CCD time-domain filter comprising:

a charge splitter receptive of an input charge for dividing said charge into a multiplicity of portions, the number of portions being at least m, an integer larger than two;

a multiplicity, m, of charge transfer channels, at least two of which provide between a respective input and output of each different numbers of charge-transfer cycles of delay than each remaining one of those charge transfer channels provides between its input and output, said charge transfer channels having respective inputs receptive of different portions of said divided input charge and having respective outputs; and means for summing the charges from the outputs of said charge transfer channels to provide the output from said CCD time-domain filter.

11. A CCD time-domain filter as set forth in claim 10 wherein said multiplicity, m, of charge transfer channels are consecutively ordinally numbered first through m$^{th}$, with the delays of charge transfer channels bearing successively higher ordinal numbers being successively longer by one charge-transfer cycle.

12. A CCD time-domain filter as set forth in claim 11 wherein the first charge transfer channel has zero charge-transfer cycles delay.

13. A CCD time-domain filter as set forth in claim 10 in combination with:

a charge injector, responsive to each one of input voltage samples suppllied on successive ones of said charge-transfer cycles, for injecting a charge linearly related to the amplitudes of those input voltage samples.

14. A combination as set forth in claim 13 wherein said charge injector is of fill-and-spill type.

* * * * *